United States Patent
Kumar et al.

(10) Patent No.: US 9,418,873 B2
(45) Date of Patent: Aug. 16, 2016

(54) INTEGRATED CIRCUIT WITH ON-DIE DECOUPLING CAPACITORS

(71) Applicants: Shailesh Kumar, Ghaziabad (IN); Vikas Garg, Delhi (IN); Sumit Varshney, Noida (IN); Chetan Verma, Noida (IN)

(72) Inventors: Shailesh Kumar, Ghaziabad (IN); Vikas Garg, Delhi (IN); Sumit Varshney, Noida (IN); Chetan Verma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/467,039

(22) Filed: Aug. 24, 2014

(65) Prior Publication Data
US 2016/0056099 A1 Feb. 25, 2016

(51) Int. Cl.
| | | |
|---|---|---|
| *H01L 23/48* | (2006.01) | |
| *H01L 23/12* | (2006.01) | |
| *H01G 2/14* | (2006.01) | |
| *H01L 21/50* | (2006.01) | |
| *H01L 23/522* | (2006.01) | |
| *H01L 23/495* | (2006.01) | |

(52) U.S. Cl.
CPC .......... *H01L 21/50* (2013.01); *H01L 23/49551* (2013.01); *H01L 23/5223* (2013.01); *H01L 23/49503* (2013.01); *H01L 2224/05553* (2013.01); *H01L 2224/32245* (2013.01); *H01L 2224/48091* (2013.01); *H01L 2224/48247* (2013.01); *H01L 2224/48464* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 5,629,240 A * | 5/1997 | Malladi | H01L 23/50 257/E23.079 |
| 7,245,519 B2 | 7/2007 | McQuirk et al. | |
| 2002/0119583 A1 | 8/2002 | Seshan | |
| 2006/0138639 A1 * | 6/2006 | Figueroa | H01L 23/49822 257/700 |
| 2007/0127169 A1 * | 6/2007 | Nguyen | H03K 17/162 361/15 |
| 2013/0278317 A1 | 10/2013 | Iversen | |

* cited by examiner

*Primary Examiner* — Pamela E Perkins
(74) *Attorney, Agent, or Firm* — Charles E. Bergere

(57) ABSTRACT

A semiconductor device has an on-die decoupling capacitor that is shared between alternative high-speed interfaces. A capacitance pad is connected to the decoupling capacitor and internal connection pads are connected respectively to the alternative interfaces. Internal connection bond wires connect the decoupling capacitor to the selected interface through the capacitance pad and the internal connection pads in the same process as connecting the die to external electrical contacts of the device.

5 Claims, 3 Drawing Sheets

INTEGRATED CIRCUIT WITH ON-DIE DECOUPLING CAPACITORS

BACKGROUND OF THE INVENTION

The present invention is directed to semiconductor integrated circuits and, more particularly, to a semiconductor die having on-die decoupling capacitors.

Semiconductor processor devices include a variety of types of high-speed (high frequency) interfaces such as Serializer/Deserializer (SerDes) lanes, Peripheral Component Interconnect Express (PCIe) buses, Media Independent Interfaces (MII), and input/output (I/O) interfaces such as RapidIO. Many of these high-speed interfaces are provided with on-die decoupling capacitors (bypass capacitors) to reduce noise on signal lines and power supply lines. Often, a separate, dedicated decoupling capacitor is provided for each high-speed interface of the design in order to avoid incompatibility of connecting the interfaces to a common decoupling capacitor.

While there may be many high-speed interfaces in a semiconductor processor device, in variants (i.e., different device personalities) of the device, several different interfaces may be unused. For example, when packaging one variant of the device, a first interface may be used but a second is unused, while in another variant, the first interface is unused but the second is used. The provision of unused decoupling capacitors represents a waste of die area and unnecessary cost, which it is desirable to avoid.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
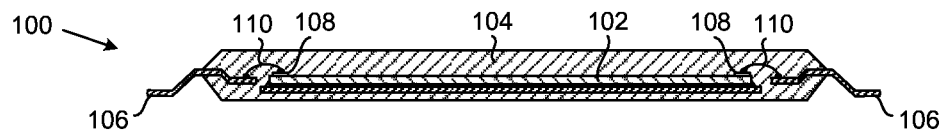
FIG. 1 is a side cross-sectional view of a packaged semiconductor device in accordance with an embodiment of the present invention.

FIG. 1 shows the structure of a packaged semiconductor device 100 in accordance with an embodiment of the present invention. The semiconductor device 100 comprises one or more singulated integrated circuit (IC) semiconductor dies 102 embedded in a molding compound package 104. The device 100 has electrical contacts for connection to external electrical circuitry, the contacts 106 being in the form of leads that project from surfaces of the molding compound. The device 100 is known as a quad flat package (QFP), although it will be understood by those of skill in the art that the invention is applicable to other types of package, such as dual flat package (DFP), quad flat no-leads (QFN), and ball grid array (BGA), for example, among many others.

Figure 2:
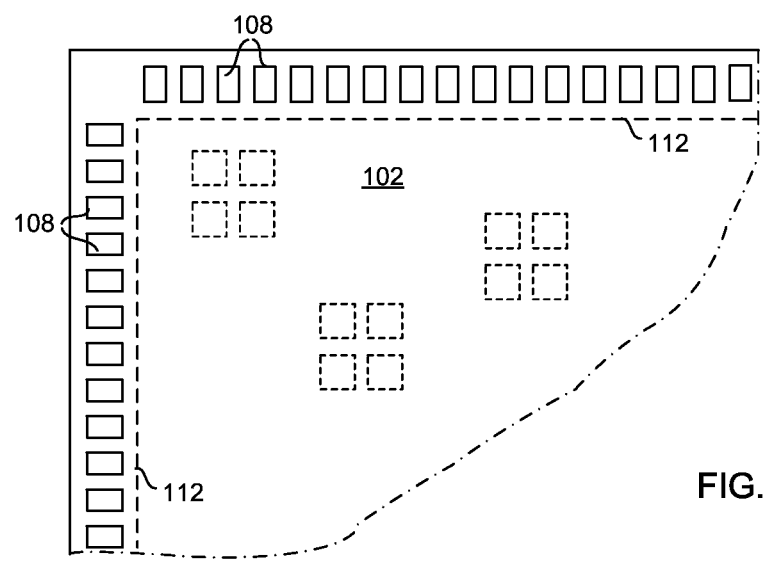
FIG. 2 is a schematic top plan view of part of the active face of one configuration of a semiconductor die of the device of FIG. 1.
Figure 3:
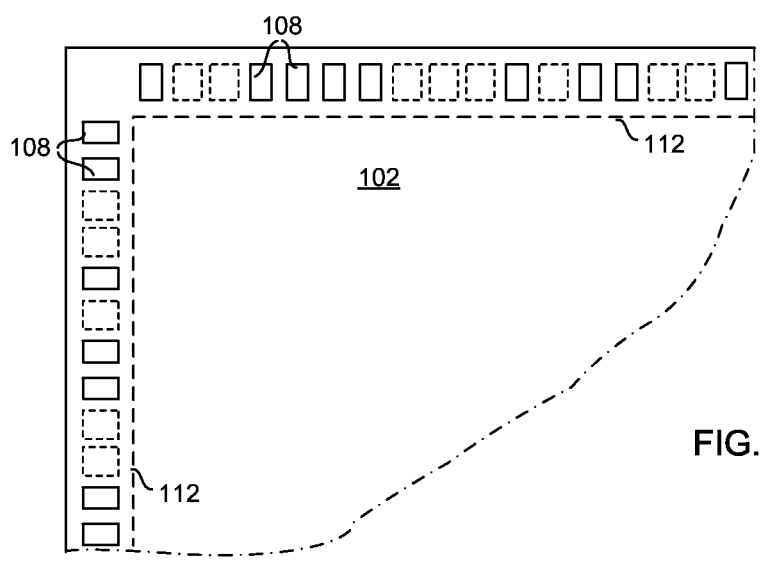
FIG. 3 is a schematic top plan view of part of the active face of another configuration of a semiconductor die of the device of FIG. 1.

The contacts 106 are connected to die bonding pads 108 on the active surface of the die 102 with bond wires 110, which make signal and power connections with the external circuitry. As shown in FIGS. 2 and 3, the die bonding pads 108 are situated in a peripheral input/output (I/O) region of the active surface of the die 102, referred to as a pad ring, outside the dashed lines 112. However, it is also possible to position the bonding pads 108 in the core region of the die 102 inside the dashed lines 112.

Figure 4:
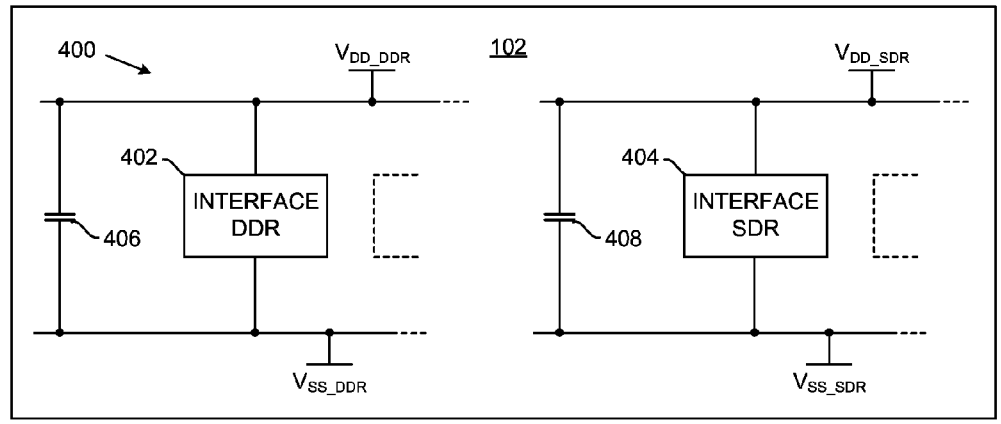
FIG. 4 is a schematic block diagram of part of a conventional circuit in a semiconductor die in the device of FIG. 1.
Figure 5:
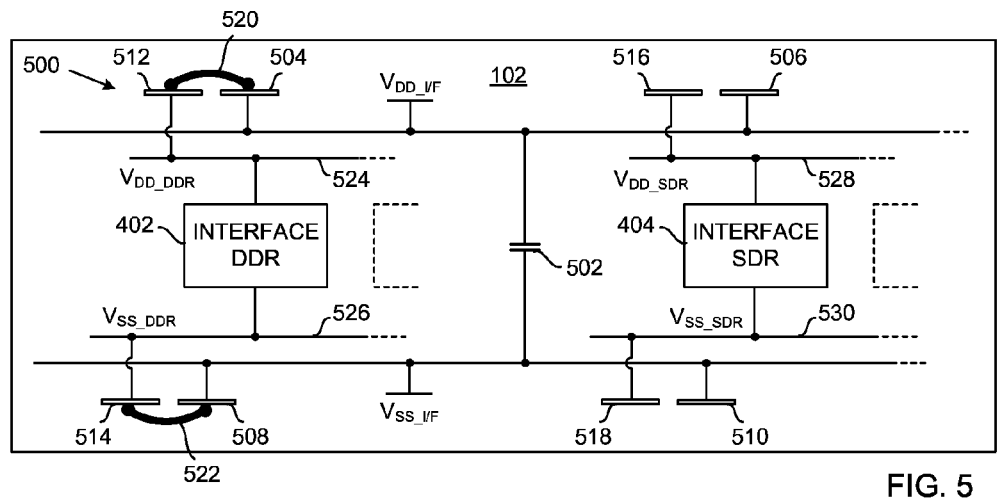
FIG. 5 is a schematic block diagram of part of a circuit of a semiconductor die of the device of FIG. 1 in accordance with an embodiment of the present invention.
Figure 6:
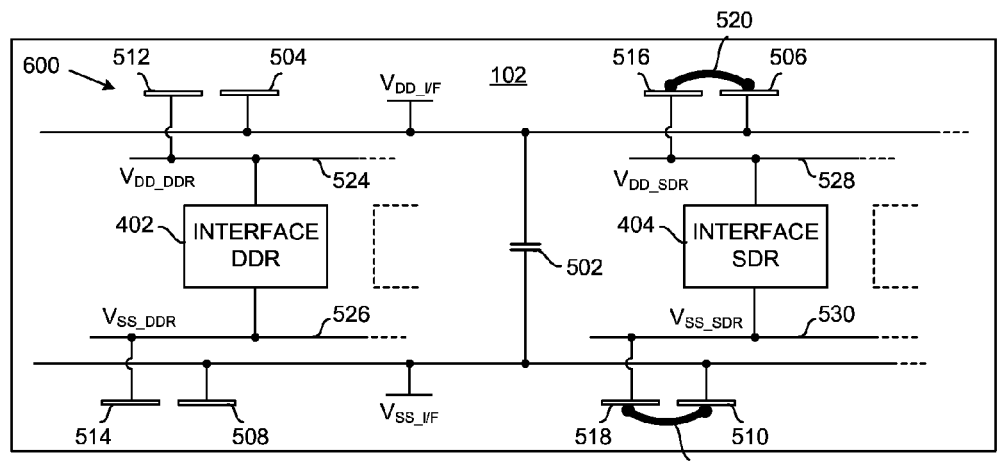
FIG. 6 is a schematic block diagram of part of the circuit of FIG. 5 in accordance with another embodiment of the present invention.

FIGS. 4 to 6 illustrate different configurations of circuits 400, 500 and 600 in the semiconductor die 102. The circuits 400, 500 and 600 include a processor having first and second high frequency interfaces 402 and 404. The interfaces 402 and 404 are provided systematically on the semiconductor die 102, enabling standardization of the layout of the semiconductor die 102. However, in certain applications, the interfaces are alternatives and only one of the two interfaces 402 and 404 is operational in a given packaged product. In this example, the interface 402 is a double data rate (DDR) interface, while the interface 404 is a single data rate (SDR) interface for the same data path and the two interfaces 402 and 404 are mutually exclusive. It will be appreciated that the invention can be applied to other kinds of interfaces that are used alternatively in different variants/personalities of the device 100.

Referring to FIG. 4, a conventional configuration of the interfaces 402 and 404 is shown in which the interfaces 402 and 404 are connected to separate pairs of power supplies $V_{DD\_DDR}$, $V_{SS\_DDR}$ and $V_{DD\_SDR}$, $V_{SS\_SDR}$ respectively, and separate dedicated decoupling capacitors 406 and 408 are provided for the two interfaces 402 and 404, connected across the power supply pairs $V_{DD\_DDR}$, $V_{SS\_DDR}$ and $V_{DD\_SDR}$, $V_{SS\_SDR}$ respectively. In cases where only one of the interfaces 402 and 404 is used in a given variant of the semiconductor device 100, the decoupling capacitor 406 or 408 connected to the other of the interfaces 402 and 404 is redundant and represents a waste of area of the semiconductor die 102. The decoupling capacitors 406 and 408 are commonly complementary metal-oxide-semiconductor (CMOS) capacitors formed in the pad ring region or the core region of the die 102, and occupy a substantial area of the die 102.

FIG. 5 shows circuit 500, where the semiconductor die 102 includes a processor having first and second interfaces 402 and 404 and at least one decoupling capacitor 502. At least one capacitor pad 504, 506, 508, 510 is connected to the decoupling capacitor 502, and first and second internal connection pads 512, 514 and 516, 518 are connected respectively to the first and second interfaces 402 and 404. The processor also includes a plurality of die bonding pads 108.

The device 100 illustrated in FIGS. 1 to 3, 5 and 6 also includes a package 104 for the semiconductor die 102 having electrical contacts 106 for connection to an external electrical circuit (not shown). A plurality of bond wires 110 connects respective die bonding pads 108 of the die 102 with the electrical contacts (leads) 106 of the package 104. At least one internal connection member 520, 522 connects selectively the decoupling capacitor through the first 512, 514 or the second 516, 518 internal connection pad and the capacitor pad 504, 506, 508, 510 for decoupling the first or the second interface 402 or 404 respectively.

In this way, a single decoupling capacitor 502 is shared between the two mutually exclusive interfaces 402 and 404. The value and the die area of the shared capacitor are significantly smaller than the sum of the capacitors 406 and 408 used in the conventional configuration 400. The value of the shared capacitor 502 can be the larger of the values required by the interfaces 402 and 404. It is also possible to use more than one decoupling capacitor 502 for the interfaces 402 and 404, while still reducing the area of the capacitors on the die 102. For example, if self-resonating frequency requirements need different capacitance values for the two interfaces 402 and 404, the value of the shared capacitance whose connection is switched between the interfaces can be less than the larger of the values required by one of the interfaces 402 and 404, and supplemented by a capacitance permanently connected to that interface to obtain the larger value required when that interface is used.

By way of example, positions for capacitor pads 504, 506, 508, 510 and internal connection pads 512, 514 and 516, 518 are shown in dashed lines in FIGS. 2 and 3.

The internal connection members 520, 522 may comprise bond wires that connect the selected internal connection pad(s) 512, 514 or 516, 518 to the capacitor pad(s) 504, 506, 508, 510. The bond wires may be bare or coated (insulated), both of which are commercially available and known by those of skill in the art. The internal connections can then be made during the same wire bonding process as the external connections. Such a process is readily adapted to different packaging requirements for different product variants. It will be appreciated that other connection techniques may be used for the selective bond wires 520, 522 provided that the selective internal connections are made late in the production process, when the product variants are differentiated.

The internal connection member may comprise a bond wire 520, 522 that connects the selected internal connection pad(s) 512, 514 or 516, 518 directly to the capacitor pad 504, 506, 508, 510 as shown in FIGS. 5 and 6.

Figure 7:
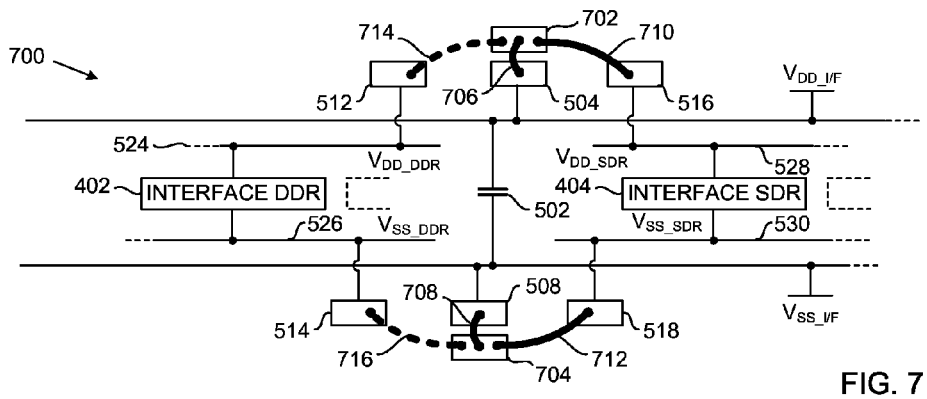
FIG. 7 is a schematic block diagram of part of another configuration of the circuit of FIG. 5 in accordance with yet another embodiment of the present invention.

In another configuration 700, illustrated in FIG. 7, the IC die also includes at least one intermediate connection pad 702, 704. The internal connection member comprises a plurality of bond wires 706, 708 that connect respectively the intermediate connection pad 702, 704 to the capacitor pad 504, 508. Bond wires 710, 712 or 714, 716 connect respectively the selected internal connection pad 512, 514 or 516, 518 to the intermediate connection pad 702, 704. The configuration is illustrated in FIG. 7 with the second interface selected by the bond wires 710, 712, and the alternative possibility of the first interface being selected is shown by the bond wires 714, 716 in dashed lines. The configuration 700 can facilitate layout of the pads and of the routing in the IC die.

The first and second interfaces 402, 404 may have first and second power distribution lines 524, 526 and 528, 530 respectively, and the first and second internal connection pads 512, 514 or 516, 518 are connected to the first and second power distribution lines 524, 526 and 528, 530 respectively. In this example, the power supply has pairs of buses $V_{DD\_I/F}$ and $V_{SS\_I/F}$ to which the decoupling capacitor 502 and the capacitor pads 504, 506, 508, are 510 connected, pairs of the internal connection members 520 and 522 connecting the buses $V_{DD\_I/F}$ and $V_{SS\_I/F}$ to the power distribution lines 524, 526 or 528, 530 selectively.

The bond wires 110 and 520, 522 for the selected one of the first and the second interfaces 402 and 404 may connect operationally the die bonding pads 108 with the leads 106 of the package 104 and the internal connection pads 512, 514 or 516, 518 with the capacitor pads 504, 506 or 508, 510 of the die 102, and leave floating internal and external connection pads of the other one of the first and the second interfaces 402, 404.

The present invention includes an IC semiconductor die 102 for connection in a device 100 and having at least one decoupling capacitor 502, at least one capacitor pad 504, 506, 508, 510 connected to the decoupling capacitor 502, and first and second internal connection pads 512, 514 and 516, 518 connected respectively to the first and second interfaces 402, 404 for connection by at least one bond wire 520, 522 alternatively to the capacitor pad 512, 514 or 516, 518 for selectively decoupling the first or the second interface 402, 404.

Figure 8:
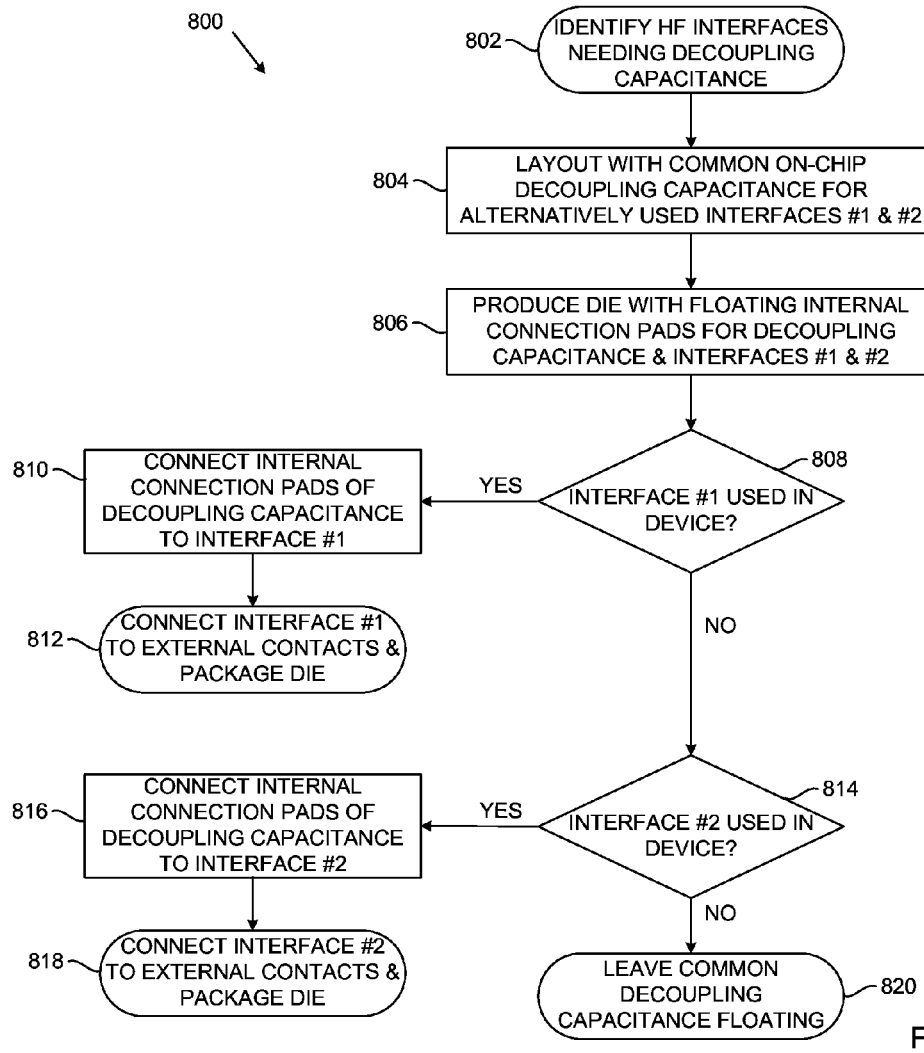
FIG. 8 is a flow chart of a method of making a semiconductor device in accordance with an embodiment of the present invention.

FIG. 8 is a flow chart illustrating a method 800 of making a semiconductor device 100 in accordance with an embodiment of the present invention. The method 800 comprises providing an IC semiconductor die 102, including a processor having first and second interfaces 402 and 404 and at least one decoupling capacitor 502. At least one capacitor pad 504, 506, 508, 510 is connected to the decoupling capacitor 502 and first and second internal connection pads 512, 514 and 516, 518 are connected respectively to the first and second interfaces 402 and 404. A package 104 for the semiconductor die 102 is provided having leads 106 for connection to external circuitry (e.g., a PCB). Respective die bonding pads are connected with the leads 106 of the package 104. The decoupling capacitance is connected selectively through the first 512, 514 or the second 516, 518 internal connection pads and the capacitor pads 504, 506, 508, 510 by at least one internal connection member 520, 522 for decoupling the first or the second interface 402 or 404 respectively.

In more detail, the method 800 starts at 802 by identifying high frequency (HF) interfaces such as 402, 404 that need decoupling capacitance such as 502. The die 102 is laid out at 804 with a common decoupling capacitance 502 for a plurality of interfaces 402, 404 that are used alternatively in different variants or personalities of the device 100. At 806, a die 102 is produced with electrically floating connection pads 512, 514 516, 518 connected to the first and second interfaces 402 and 404 and electrically floating capacitor pads 504, 506, 508, 510 connecting within the die with the decoupling capacitance 502, and through which selective connections can be made to the capacitance 502.

A decision is taken at 808 whether the first interface 402 is to be used in the device 100. If it is, at 810 the capacitor pads 504, 508 are connected selectively to the first interface 402 through the internal connection pads 512, 514 with bond wires 520, 522, so that the capacitance 502 is connected to decouple the first interface 402. The first interface 402 is then connected with package leads 106 through the die bonding pads 108 at 812.

If at 808 the first interface 402 is not to be used in the device 100, a decision is taken at 814 whether the second interface 404 is to be used in the device 100. If it is, at 816 the capacitor pads 506, 510 are connected selectively to the second interface 404 through the internal connection pads 516, 518 by bond wires 520, 522 so that the capacitor 502 is connected to decouple the first interface 404. The second interface 404 is then connected with package leads 106 through the die bonding pads 108 at 818.

If at 814 the second interface 40 is not to be used in the device 100 either, the capacitor pads 504, 506, 508, 510 are left floating.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor die described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device, comprising:
   an integrated circuit (IC) die including a processor having first and second interfaces, at least one decoupling capacitor, at least one capacitor pad connected to the decoupling capacitor, first and second internal connection pads connected respectively to the first and second interfaces, at least one intermediate connection pad, and a plurality of die bonding pads;
   a package for the semiconductor die having electrical contacts for connection to external electrical circuitry;
   a plurality of external connection members comprising first bond wires that connect respective die bonding pads with the package electrical contacts;
   at least one internal connection member selectively connecting the decoupling capacitor by way of the first or the second internal connection pad and the capacitor pad for decoupling the first or the second interface respectively, and
   wherein the internal connection member comprises second bond wires that respectively connect the intermediate connection pad to the capacitor pad, and the selected internal connection pad to the intermediate connection pad.

2. The semiconductor device of claim 1, wherein the first and second interfaces have first and second power distribution lines respectively, and the first and second internal connection pads are connected to the first and second power distribution lines respectively.

3. The semiconductor device of claim 1, wherein the second bond wires for the selected one of the first and the second interfaces operationally connect the die bonding pads with the package electrical contacts and the internal connection pads with the capacitor pad of the die, and leave floating die bonding pads and the internal connection pads of the other one of the first and the second interfaces.

4. A semiconductor integrated circuit (IC) die, comprising:
   a processor including first and second interfaces;
   die bonding pads for connection to external electrical contacts of a package for the die;
   at least one decoupling capacitor;
   at least one capacitor pad connected to the decoupling capacitor; and
   first and second internal connection pads respectively connected to the first and second interfaces for connection by at least one internal connection member alternatively to the capacitor pad for decoupling the first or the second interface,
   wherein:
      the die bonding pads are connectable by first bond wires to the external contacts,
      the internal connection pads are connectable by at least one second bond wire alternatively to the capacitor pad,
      the IC die also includes at least one intermediate connection pad that is connectable by a third bond wire to the capacitor pad, and
      the internal connection pads are connectable alternatively by the at least one second bond wire to the intermediate connection pad.

5. The semiconductor die of claim 4, wherein the first and second interfaces have first and second power distribution lines respectively, and the first and second internal connection pads are connected to the first and second power distribution lines respectively.

* * * * *